(12) United States Patent
Lee et al.

(10) Patent No.: US 7,190,206 B2
(45) Date of Patent: Mar. 13, 2007

(54) INTERFACE CIRCUIT AND SIGNAL CLAMPING CIRCUIT USING LEVEL-DOWN SHIFTER

(75) Inventors: Jae-hyung Lee, Suwon (KR); Kyu-hyoun Kim, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 194 days.

(21) Appl. No.: 10/890,493

(22) Filed: Jul. 13, 2004

(65) Prior Publication Data

US 2005/0017783 A1    Jan. 27, 2005

(30) Foreign Application Priority Data

Jul. 22, 2003    (KR) ...................... 10-2003-0050268
Nov. 25, 2003   (KR) ...................... 10-2003-0084196

(51) Int. Cl.
*H03L 5/00* (2006.01)
(52) U.S. Cl. ..................................... 327/333
(58) Field of Classification Search ................ 327/108, 327/112, 309, 318–319, 321–322, 328, 333; 326/68, 80–83, 62
See application file for complete search history.

(56) References Cited

U.S. PATENT DOCUMENTS 6,744,298 B2 *  6/2004  Yamauchi et al. .......... 327/333

6,980,035 B1 * 12/2005  Zhou et al. .................. 327/112

FOREIGN PATENT DOCUMENTS

KR     1999-63508     7/1999

* cited by examiner

*Primary Examiner*—My-Trang Nu Ton
(74) *Attorney, Agent, or Firm*—F. Chau & Assoc., LLC

(57) ABSTRACT

Provided are an interface circuit and a signal clamping circuit using a level-down shifter. The interface circuit includes the level-down shifter between a first power circuit driven by a first power and a second power circuit driven by a second power. The level-down shifter converts an output of the first power circuit that has a voltage level of the first power into an output of a voltage level of the second power. The level-down shifter includes a first circuit unit, a second circuit unit, a third circuit unit, and a fourth circuit unit. The first circuit unit is driven by the first power and receives the output of the first power circuit. The second circuit unit is driven by the second power and receives the output of the first power circuit. The third circuit unit is driven by the second power and receives the output of the first power circuit. The fourth circuit unit is driven by the second power, receives an output of the third circuit unit, and is connected to an output of the second circuit unit.

6 Claims, 6 Drawing Sheets

INTERFACE CIRCUIT AND SIGNAL CLAMPING CIRCUIT USING LEVEL-DOWN SHIFTER

CROSS REFERENCE TO RELATED APPLICATION

This application claims priority to Korean Patent Application Nos. 2003-50268, filed on Jul. 22, 2003, and 2003-84196, filed on 25 Nov. 2003 in the Korean Intellectual Property Office, the disclosure of both applications are hereby incorporated by reference in their entirety.

BACKGROUND OF THE INVENTION

1. Field of the Invention

The present invention relates to a semiconductor integrated circuit, and more particularly, to an interface circuit including a level-down shifter.

2. Discussion of the Related Art

For semiconductor devices used in mobile products, low power consumption is an important characteristic. In general, semiconductor integrated circuits (ICs) require an external power source to provide power to operate. Typically, the external power source is pulled down to an internal power and the internal power is used to operate the IC or chip. For example, semiconductor ICs receive an external power of about 3.3V and generate an internal power of about 1.8V to about 2.2V. An interface circuit is needed to handle a voltage difference between a circuit operating at 3.3V and a circuit operating at 1.8V. The interface circuit is generally used in an input buffer circuit or an output buffer circuit that is interfaced with the outside.

FIG. 1 shows signal transmission between a first circuit 110 operating at an external power of about 3.3V and a second circuit 120 operating at an internal power of about 1.8V. An input signal IN that undergoes full swing from 0V to 3.3V is input to the first circuit 110. For convenience of explanation, it is understood that the first circuit 110 and the second circuit 120 perform simple inverting operation. The first circuit 110 inverts the input signal IN and outputs the inverted IN signal to a first node NA and the second circuit 120 in turn inverts the inverting signal at NA and outputs the resulting signal to a second node NB.

Here, referring to a signal waveform of the first node NA and a signal waveform of the second node NB, the first node NA transits from a logic high level to a logic low level by swinging from about 3.3V to 0V and transits from a logic low level to a logic high level by swinging from 0V to about 3.3V. Thus, a midpoint of the transition of the first node NA is approximately about 1.65V. Since the operating power of the second circuit 120 is about 1.8V, a trigger point T1 of the second circuit 120 is lowered below a midpoint of the trigger point of the first circuit 110, i.e., at about 1.65V.

In response to the first node NA that transits from the logic high level of about 3.3V to the logic low level of 0V, the second node NB transits from the logic low level of 0V to the logic high level of about 1.8V. Since a trigger point of the second circuit 120 is low, the amount of time required for the transition of the signal at the second node NB increases. In response to the first node NA that transits from the logic low level of 0V to the logic high level of about 3.3V, the second node NB transits from the logic high level of 1.8V to the logic low level of 0V and the amount of time required for the transition of the second node NB decreases. As a result, there exists a transition interval Δ between the midpoint of the transition from the logic low level to the logic high level and the midpoint of the transition from the logic high level to the logic low level. Such a transition interval causes skew. Moreover, occurrence of skew increases as the difference between the external power sources increases. Also, occurrence of skew changes the duty cycle of a signal at the second node NB.

Furthermore, the change in the duty cycle of the signal increases a set-up/hold time margin of the signal and reduces a valid window. Reduction in the valid window degrades performance of the chip.

Therefore, there is a need for an interface circuit that provides an output signal such that the amount of time required for transitions to the logic high level and the logic low level are balanced and output without minimized skew.

SUMMARY OF THE INVENTION

A level-down shifter is provided, comprising: a first circuit unit having an input and an output and connected to a first power node, the first circuit unit receives at its input an input signal that swings from ground to a first voltage level; a second circuit unit having an input and an output and connected to a second power node, the second circuit unit receives at its input the output of the first circuit unit; a third circuit unit having an input and an output and connected to the second power node, the third circuit unit receives at its input the input signal; and a fourth circuit unit having an input and an output and connected to the second power node, the fourth circuit unit receives at its input the output of the third circuit unit and is connected to the output of the second circuit unit, wherein a first voltage is applied to the first power node and a second voltage is applied to the second power node. The first voltage is set at the first voltage level, and the first voltage level is higher than the second voltage. Preferably, the first power has the voltage level ranging from about 2.0V to about 2.8 V and the second power has a voltage level ranging from about 1.8V to about 2.2V The level-down shifter may comprise an inverter, which is driven by the first power and receives the input signal; a first PMOS transistor in the second circuit unit whose source is connected to the second power and whose gate is connected to a drain of a second PMOS transistor, the second PMOS having its source connected to the second power and its gate connected to a drain of the first PMOS transistor; a first NMOS transistor whose drain is connected to the drain of the first PMOS transistor, whose gate is connected to the input signal, and whose source is connected to ground; and a second NMOS transistor whose drain is connected to a drain of the second PMOS transistor, whose gate is connected to an output of the inverter, and whose source is connected to ground.

An interface circuit is also provided, comprising a first inverter, which is driven by a first power and receives an input signal that swings from ground to a voltage level of a second power; a second inverter, which is driven by the second power and receives the input signal; a PMOS transistor whose source is connected to the first power and whose gate is connected to an output of the first inverter; and an NMOS transistor whose source is connected to ground, whose gate is connected to an output of the second inverter, and whose drain is connected to a drain of the PMOS transistor, wherein a voltage level of the second power is higher than the voltage level of the first power.

According to another embodiment of the disclosure, an interface circuit comprises a first power circuit having an input and an output, powered by a first power and receives an input signal that swings from a ground voltage level to a voltage level of the first power; a level-down shifter which converts the output of the first power circuit from a voltage level of the first power to an output having a voltage level of a second power; and a second power circuit having an input and an output, powered by the second power and receives the output of the level-down shifter, and outputs an output signal that swings from ground to the voltage level of the second power, wherein the first power has the voltage level ranging from 2.0V to about 2.8V and the second power has a voltage level ranging from about 1.8 V to about 2.2V.

BRIEF DESCRIPTION OF THE DRAWINGS

The above and other aspects of the present invention will become more apparent by describing in detail exemplary embodiments thereof with reference to the attached drawings in which.

DETAILED DESCRIPTION OF THE PREFERRED EMBODIMENT

Figure 1:
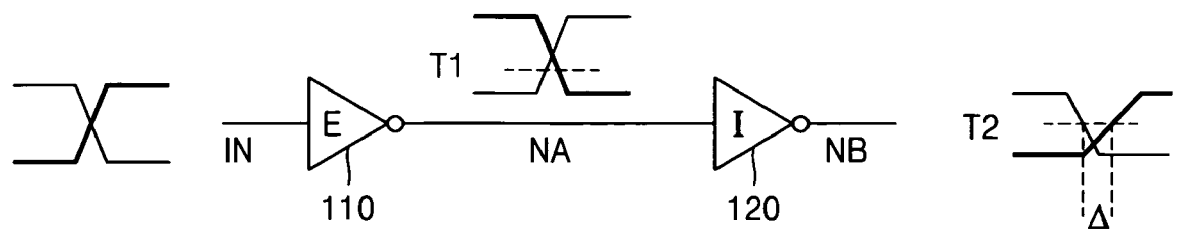
FIG. 1 shows signal transmission between a circuit operating at an external power and a circuit operating at an internal power.

Embodiments of the present invention will now be described more fully with reference to the accompanying drawings in which like reference numerals refer to like elements.

Figure 2:
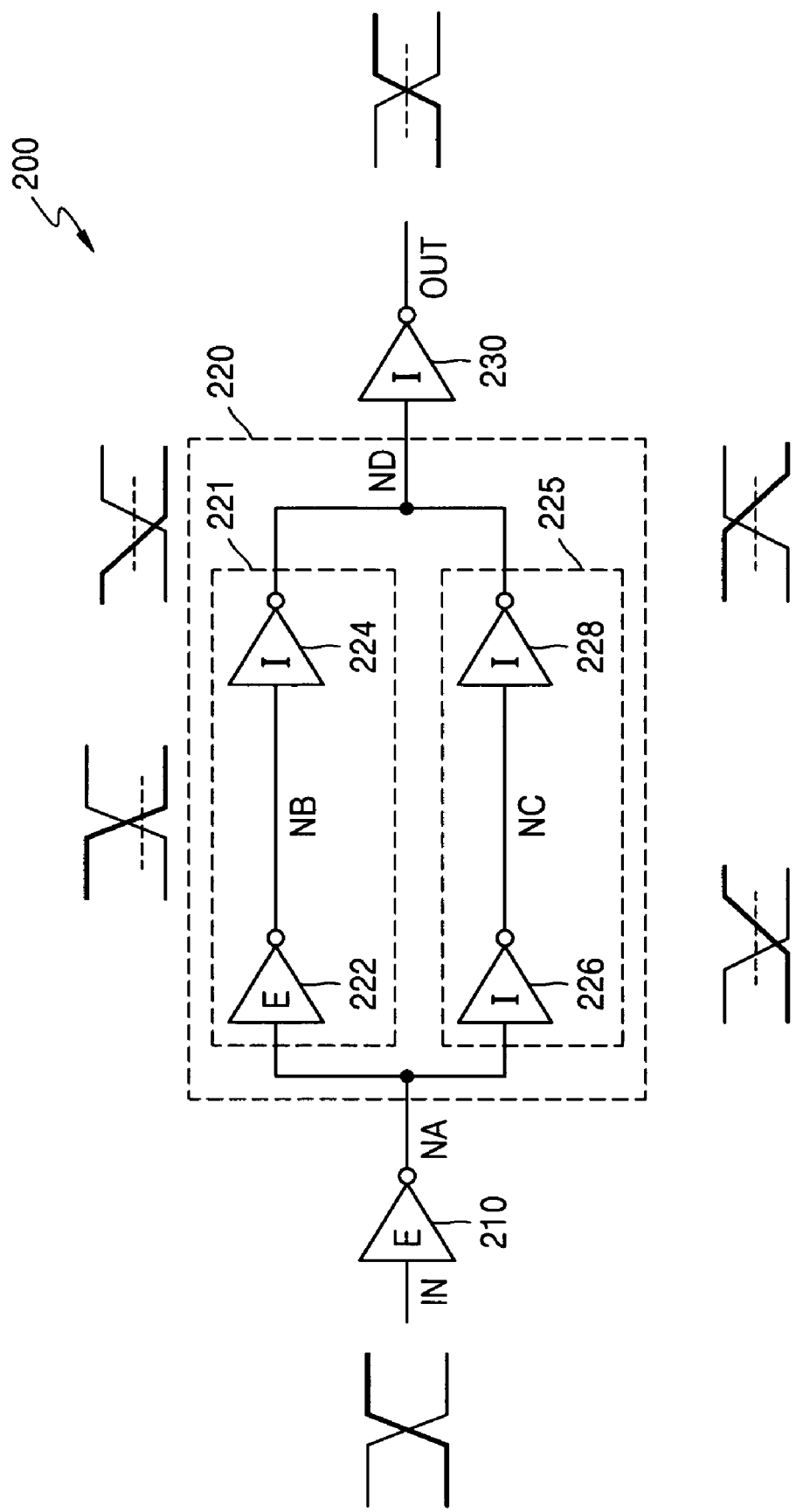
FIG. 2 illustrates an interface circuit including a level-down shifter, according to a first embodiment of the present invention.

FIG. 2 illustrates an interface circuit including a level-down shifter according to a first embodiment of the present invention. Referring to FIG. 2, an interface circuit 200 includes an external power circuit unit 210, a level-down shifter 220, and an internal power circuit unit 230. The external power circuit unit 210 is powered by an external power E. It receives an input signal IN, and outputs an output signal to a first node NA. The level-down shifter 220 includes a first path circuit 221 and a second path circuit 225. The first path circuit 221 includes a first circuit unit 222 and a second circuit unit 224 that are serially connected between the first node NA and a fourth node ND. The second path circuit 225 includes a third circuit unit 226 and a fourth circuit unit 228 that are serially connected between the first node NA and the fourth node ND. The internal power circuit unit 230 is powered by an internal power I. It receives a signal at a fourth node ND, and outputs an output signal OUT.

The first circuit unit 222 of the first path circuit 221 is connected to a first power node (not shown) suitable for application of a first power voltage. The first power voltage is preferably applied from an external source. The second circuit unit 224 of the first path circuit 221 is connected to a second power node, which is in turn connected to an internal power I. The third circuit unit 226 and the fourth circuit unit 228 of the second path circuit 225 are also connected to the second power node.

For purposes of explaining the operation of the interface circuit 200, it is preferred that the external power circuit unit 210, the first through fourth circuit units 222, 224, 226, and 228, and the internal power circuit unit 230 operate as an inverter. The voltage level of the external power E is set to about 2.8V and the voltage level of the internal power I is set to about 1.8V. Bold-type signal waveforms indicated at nodes IN, NA, NB, NC, ND, and OUT are formed in response to the transition of the input signal IN from the logic low level to the logic high level. Thin-type signal waveforms indicated at nodes IN, NA, NB, NC, ND, and OUT are formed in response to the transition of the input signal IN from the logic high level to the logic low level.

First, considering the bold-type signal waveforms, the input signal IN transits from the logic low level of 0V or ground to the logic high level of about 2.8V. The trigger point of the external power circuit unit 210 corresponds to the midpoint about 1.4V of the external power at about E 2.8V. The first node NA transits from the logic high level of about 2.8V to the logic low level of 0V.

The trigger point of the first circuit unit 222 of the first path circuit unit 221 corresponds to the midpoint about 1.4V of the external power E, at about 2.8V, and the second node NB transits from the logic low level of 0V to the logic high level of about 2.8V. The trigger point of the second circuit unit 224 corresponds to the midpoint about 0.9V of the internal power I at about 1.8V. The second circuit unit 224 is triggered at a voltage level about 0.9V, which is lower than the midpoint of about 1.4V of the transition of the second node NB. Thus, the fourth node ND transits more quickly from the logic high level of about 1.8V to the logic low level of 0V.

The trigger point of the third circuit unit 226 of the second path circuit unit 225 corresponds to the midpoint of about 0.9V of the internal power I at about 1.8V. The third circuit unit 226 is triggered at the voltage level of about 0.9V, which is lower than the midpoint of about 1.4V of the transition of the first node NA. Thus, the third node NC transits slower from the logic low level of 0V to the logic high level of about 1.8V. The trigger point of the fourth circuit unit 228 corresponds to the midpoint of the internal power I of about 1.8V. The fourth circuit unit 228 is triggered at the midpoint of the transition of the third node NC. Thus, the fourth node ND transits slower from the logic high level of about 1.8V to the logic low level of 0V.

With the circuit connected as described, the fourth node ND transits from about 1.8V to 0V faster via the first path circuit unit 221 as compared to the second path circuit unit 225. The signal at the fourth node ND is input to the internal power circuit unit 230. The internal power circuit unit 230 generates an output signal OUT that transits from the logic low level of 0V to the logic high level of about 1.8V in response to the fourth node ND.

Next, considering the thin-type signal waveforms, the input signal IN transits from the logic high level of about 2.8V to the logic low level of 0V. The trigger point of the external power circuit unit 210 corresponds to the midpoint of the external power E at about 2.8V, and the first node NA transits from the logic low level of 0V to the logic high level of 2.8V.

The trigger point of the first circuit unit 222 of the first path circuit unit 221 corresponds to the midpoint 1.4V of the external power E, at about 2.8V, and the second node NB transits from the logic high level of about 2.8V to the logic low level of 0V. The trigger point of the second circuit unit 224 corresponds to the midpoint 0.9V of the internal power I at about 1.8V. The second circuit unit 224 is triggered at the voltage level of 0.9V, which is lower than the midpoint 1.4V of the transition of the second node NB. Thus, the fourth node ND transits slower from the logic low level of 0V to the logic high level of about 1.8V.

The trigger point of the third circuit unit 226 of the second path circuit unit 225 corresponds to the midpoint 0.9V of the internal power I at about 1.8V. The third circuit unit 226 is triggered at the voltage level 0.9V, which is lower than the midpoint 1.4V of the transition of the first node NA. Thus, the third node NC transits faster from the logic high level of about 1.8V to the logic low level of 0V. The trigger point of the fourth circuit unit 228 corresponds to the midpoint 0.9V of the internal power I at about 1.8V. The fourth circuit unit 228 is triggered at the midpoint 0.9V of the transition of the third node NC. Thus, the fourth node ND transits faster from the logic low level of 0V to the logic high level of about 1.8V.

Here, the fourth node ND transits slower from 0V to 1.8V via the first path circuit unit 221 as compared to the second path circuit unit 225.

Therefore, referring to the waveforms of the input signal IN and the output signal OUT of the interface circuit 200 in this embodiment, in response to the input signal IN that transits from the logic low level of 0V to the logic high level of about 2.8V and from the logic high level of about 2.8V to the logic low level of 0V, the output signal OUT transits from the logic low level of 0V to the logic high level of about 1.8V and from the logic high level of about 1.8V to the logic low level of 0V. The midpoints of the two transition intervals are substantially identical. Hence, the output signal OUT has minimal or no skew.

Figure 3:
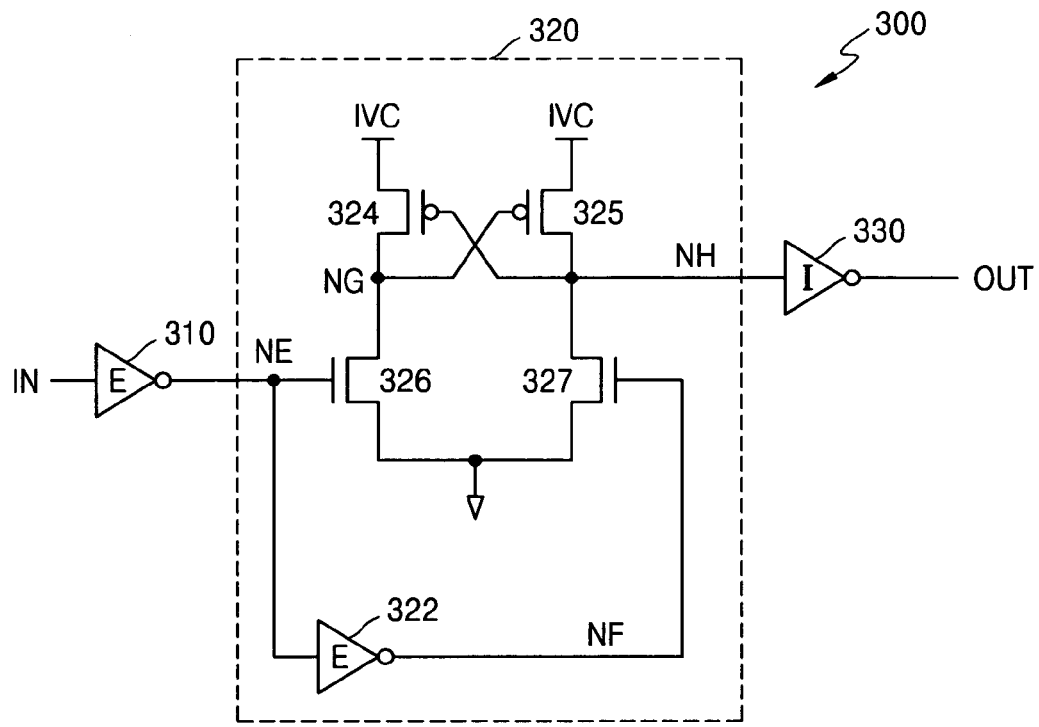
FIG. 3 illustrates an interface circuit including a level-down shifter, according to another embodiment of the present invention.

FIG. 3 illustrates an interface circuit 300 including a level-down shifter 320, according to another embodiment of the present invention. Referring to FIG. 3, the interface circuit 300 includes an external power circuit unit 310, the level-down shifter 320, and an internal power circuit unit 330. The external power circuit unit 310 is driven by an external power E. It receives an input signal IN, and outputs the input signal IN to the level-down shifter 320. The internal power circuit unit 330 is driven by an internal power I. It receives an output of the level-down shifter 330, and outputs an output signal OUT.

The level-down shifter 320 shifts a voltage level of the external power E at node NE of the external power circuit unit 310 down to a voltage level of the internal power I. As shown, the level-down shifter 320 includes an inverter 322, a first PMOS transistor 324, a second PMOS transistor 325, a first NMOS transistor 326, and a second NMOS transistor 327.

An input of the inverter 322 is connected to the node NE of the external power circuit unit 310. Sources of the first and second PMOS transistors 324 and 325 are connected to an internal power voltage IVC. The gate of the first PMOS transistor 324 is connected to the drain of the second PMOS transistor 325 and the gate of the second PMOS transistor 325 is connected to the drain of the first PMOS transistor 324. A drain of the first NMOS transistor 326 is connected to a drain of the first PMOS transistor 324. A gate of the first NMOS transistor 326 is connected to the output node NE of the external power circuit unit 310. A source of the first NMOS transistor 326 is connected to the ground voltage VSS. A drain of the second NMOS transistor 327 is connected to a drain of the second PMOS transistor 325. A gate of the second NMOS transistor 327 is connected to an output of the inverter 322. A source of the second NMOS transistor 327 is connected to the ground voltage VSS. The drains of the second PMOS transistor 325 and the second NMOS transistor 327 that are connected with each other serve as an output node NH of the level-down shifter 320 and are input to the internal power circuit unit 330.

Figure 4:
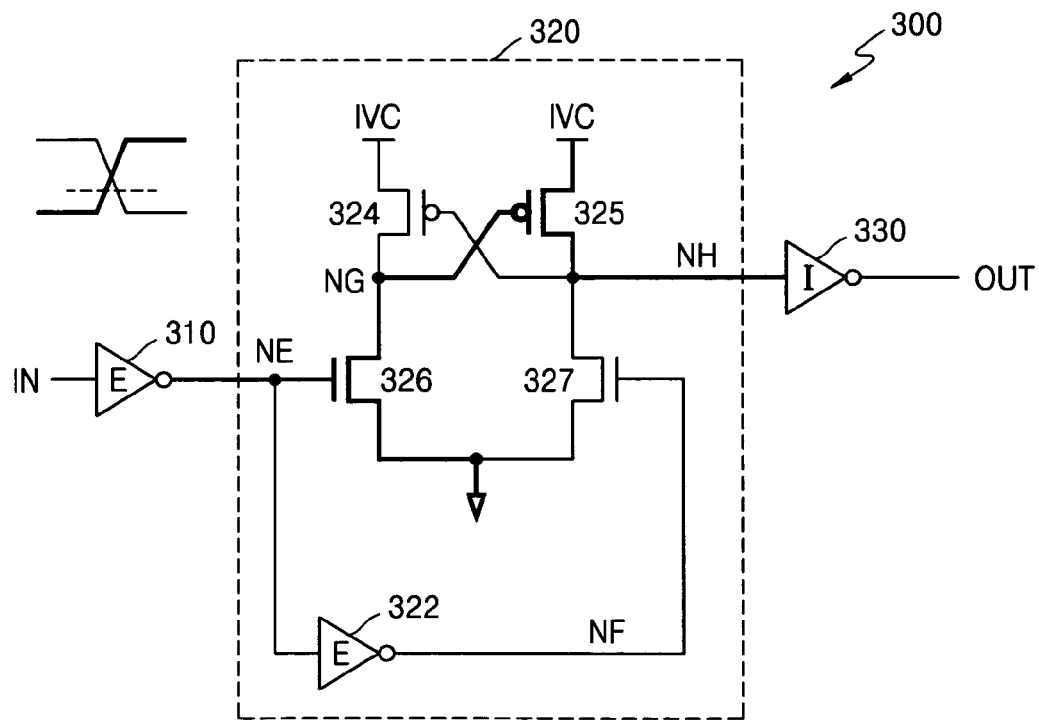
FIGS. 4 and 5 show an exemplary operation of the level-down shifter of FIG. 3.

The operation of the interface circuit 300 according to this embodiment of the present invention is described based on a rising edge transition and a falling edge transition of a signal at the node NE which is input to the level-down shifter 320. Referring to FIG. 4, a low-to-high (rising edge) transition at the output node NE is marked with a bold line. Assuming that the voltage level of the external power E is about 2.8V, the output node NE undergoes the rising edge transition from 0V to about 2.8V. The first NMOS transistor 326 of the level-down shifter 320 is turned on when a gate-source voltage Vgs of the first NMOS transistor 326 is more than a threshold voltage Vth of the first NMOS transistor 326. For example, the first NMOS transistor 326 is turned on at a trigger point of about 0.6V of the node NE, which is marked with a dotted line. Subsequently, a node NG transits to a logic low level of 0V and the second PMOS transistor 325 is turned on. When the second PMOS transistor 325 is turned on, an output node NH of the level-down shifter 320 transits to the voltage level near the internal power voltage IVC, e.g., a logic high level of about 1.8V.

In other words, once a voltage at the node NE rises to the threshold voltage Vth of the first NMOS transistor 326 while the output node NE swings from 0V to 2.8V, the output node NH of the level-down shifter 320 transits quickly from 0V to about 1.8V.

Figure 5:
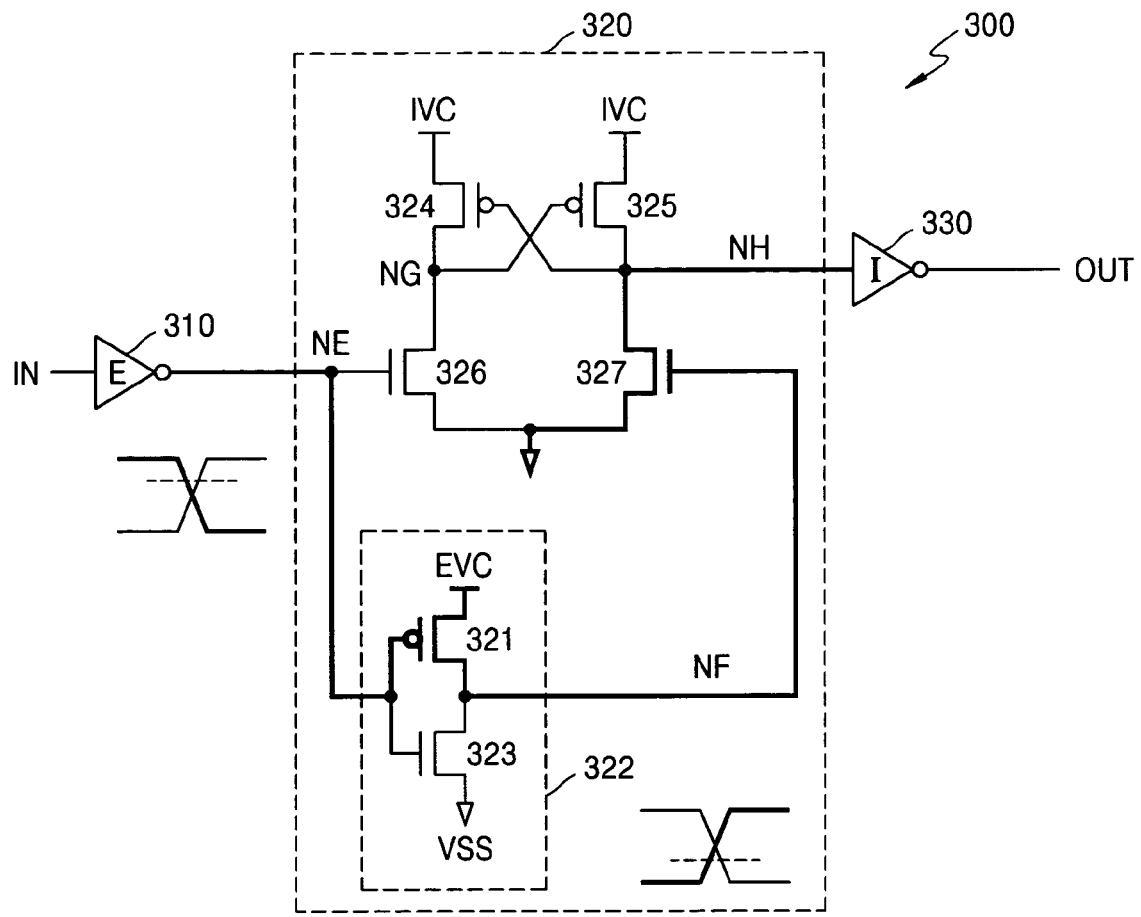

Referring to FIG. 5 wherein the falling edge transition from high-to-low is marked with a bold line. In response to the falling edge transition of the output node NE from about 2.8V to 0V, a PMOS transistor 321 of the inverter 322 is turned on when a gate-source voltage Vgs of the PMOS transistor 321 is more than a threshold voltage Vth of the PMOS transistor 321. For example, the PMOS transistor 321 is turned on at a trigger point of about 2.2V while the output node NE swings from about 2.8V to 0V. When the PMOS transistor 321 is turned on, an output node NF undergoes a rising edge transition from 0V to about 2.8V. A second NMOS transistor 327 of the level-down shifter 320 is turned on when a gate-source voltage Vgs of the second NMOS transistor 327 is more than a threshold voltage Vth. For example, the second NMOS transistor 327 is turned on at a trigger point about 0.6V at the output node NF (see dotted line) while the output node NF swings from 0V to about 2.8V. When the second NMOS transistor 327 is turned on, an output node NH of the level-down shifter 320 transits to a logic low level of near 0V or ground voltage VSS.

In other words, in response to the transition from 0V to about 2.8V of the output node NE that is input to the level-down shifter 320, once the voltage at the output node NE drops to a threshold voltage Vth of the PMOS transistor 321 and an output of the inverter 322 rises to the threshold voltage Vth of the PMOS transistor 321, the output node NH of the level-down shifter 320 fast transits from about 1.8V to 0V.

Figure 6:
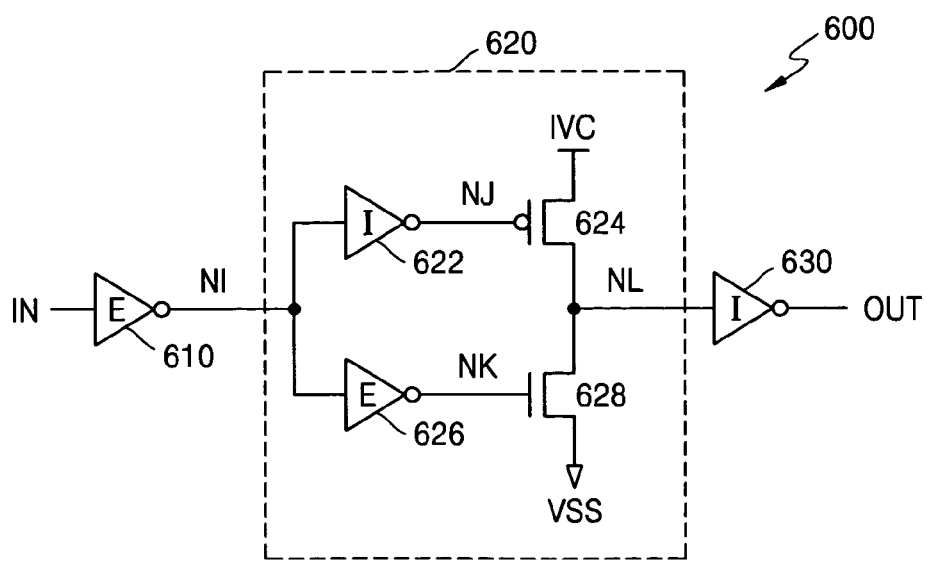
FIG. 6 illustrates an interface circuit including a level-down shifter, according to still another embodiment of the present invention.

FIG. 6 illustrates a circuit including a level-down shifter 600, according to another embodiment of the present invention.

Referring to FIG. 6, the interface circuit 600 includes an external power circuit unit 610, a level-down shifter 620, and an internal power circuit unit 630. The interface circuit 600 converts an input signal IN at the voltage level of the external power E into an output signal OUT at the voltage level of the internal power I.

The level-down shifter 620 includes a first inverter 622, a second inverter 626, a PMOS transistor 624, and an NMOS transistor 628.

The first inverter 622 receives the output of the external power circuit unit 610 and is driven by the internal power I. The second inverter 626 receives an output of the external power circuit unit 610 and is driven by the external power E. A source of the PMOS transistor 624 is connected to the internal power voltage IVC. A gate of the PMOS transistor 624 is connected to an output of the first inverter 622. A source of the NMOS transistor 628 is connected to the ground voltage VSS. A gate of the NMOS transistor 628 is connected to an output of the second inverter 626. A drain of the NMOS transistor 628 is connected to a drain of the PMOS transistor 624.

Figure 7:
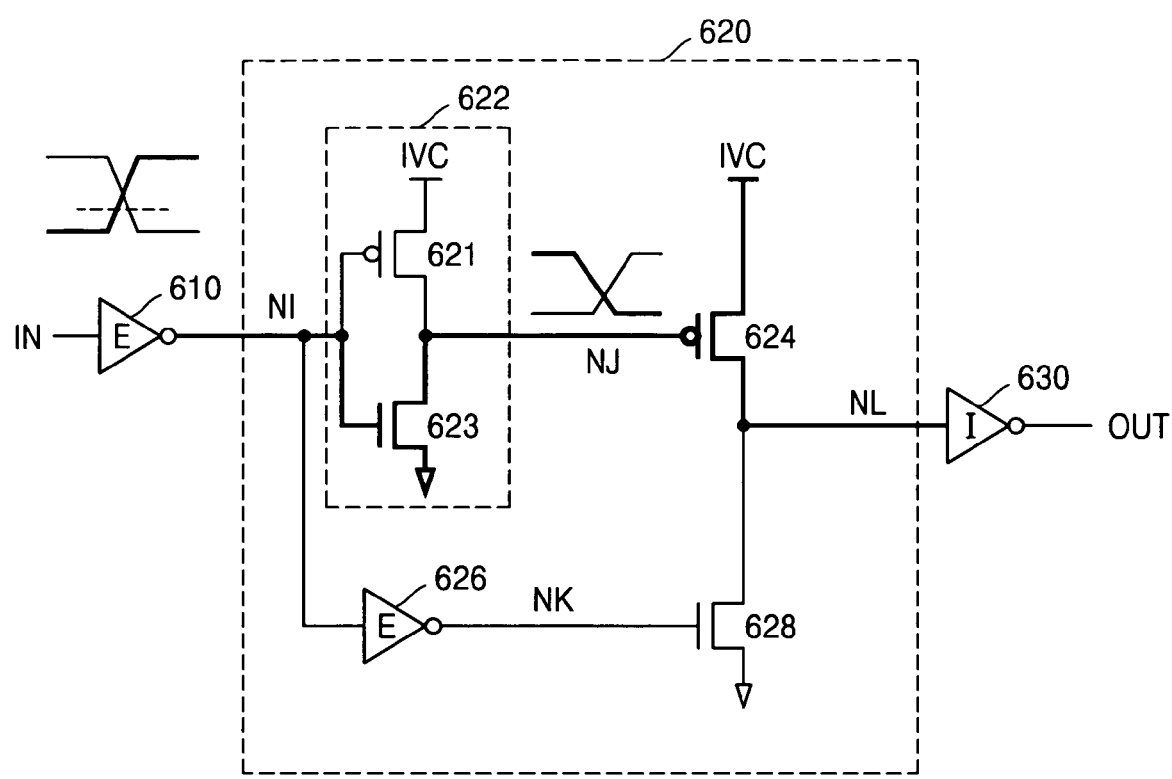
FIGS. 7 and 8 shows an exemplary operation of the level-down shifter of FIG. 6.

FIG. 7 is a view showing an operation of the level-down shifter 620 of FIG. 6 with a rising edge transition of an output node NI of the external power circuit unit 610.

Referring to FIG. 7, a low-to-high (rising edge) transition of the output node NI is marked with a bold line. Assuming that the voltage level of the external power E is about 2.8V, the output node NI undergoes a rising transition from 0V to about 2.8V. The NMOS transistor 623 of the first inverter 622 of the level-down shifter 620 is turned on when a gate-source voltage Vgs of the NMOS transistor 623 is more than a threshold voltage Vth of the NMOS transistor 623. For example, the NMOS transistor 623 is turned on at a trigger point of about 0.6V of the output node NI (marked with a dotted line). Subsequently, a node NJ transits to a logic low level and the PMOS transistor 624 is turned on. When the PMOS transistor 624 is turned on, an output node NL of the level-down shifter 620 transits to a logic high level of about 1.8V, near the voltage level of internal power voltage IVC.

In other words, once a voltage at the node NI that is input to the level-down shifter 620 rises to a threshold voltage Vth of the NMOS transistor 623 while the node NI swings from 0V to 2.8V, the output node NL of the level-down shifter 620 transits quickly from 0V to 1.8V.

Figure 8:
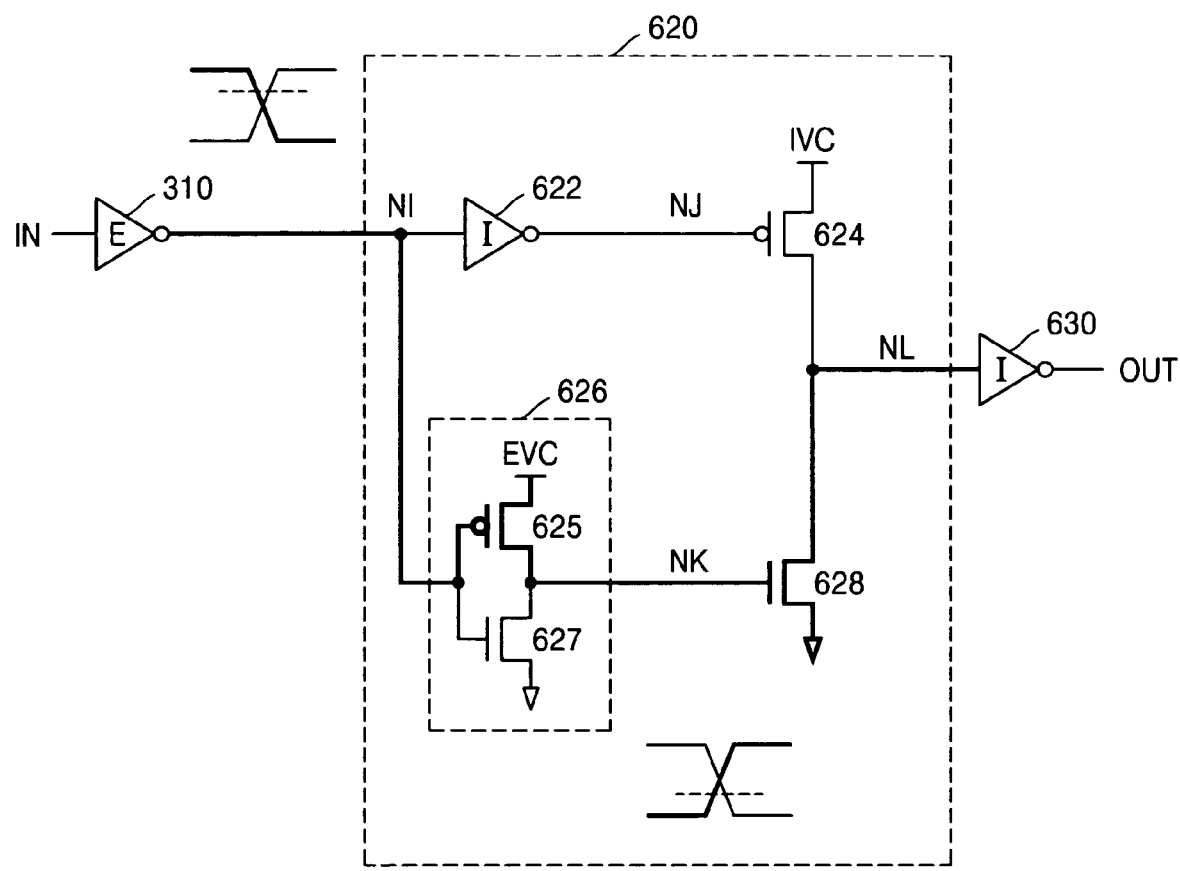

FIG. 8 shows an operation of the level-down shifter 620 with a falling edge transition of the output node NE of the external power circuit unit 610.

Referring to FIG. 8, a high-to-low (falling edge) transition of the node NI is marked with a bolded line. In response to a falling edge transition of the node NI from about 2.8V to 0V, a PMOS transistor 625 is turned on when a gate-source voltage Vgs of the PMOS transistor 625 of the second inverter 626 is more than a threshold voltage Vth of the PMOS transistor 625, e.g., more than 0.6V. For example, the second PMOS transistor 625 is turned on at a trigger point of about 2.2V (dotted line) while the node NI swings from about 2.8V to 0V. When the PMOS transistor 625 is turned on, a node NK transits from 0V to about 2.8V. The NMOS transistor 628 is turned on when a gate-source voltage Vgs of the NMOS transistor 628 is more than a threshold voltage of the NMOS transistor 628, e.g., more than about 0.6V. For example, the NMOS transistor 628 is turned on at a trigger point about 0.6V (dotted line) while the node NK swings from 0V to about 2.8V. By the NMOS transistor 628 that is turned on, an output node NL of the level-down shifter 620 transits to a logic low level of 0V or the ground voltage VSS.

In other words, in response to the transition from 2.8V to 0V of the node NI that is input to the level-down shifter 620, once the voltage at the node NI drops to a threshold voltage Vth of the PMOS transistor 625 and an output of the inverter 626 rises to the threshold voltage Vth of the PMOS transistor 625, the output node NL of the level-down shifter 620 transits quickly from about 1.8V to 0V.

Figure 9:
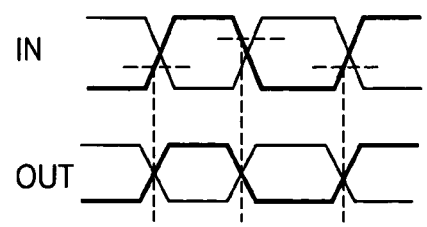
FIG. 9 is a timing diagram showing signals of level-down shifters according to embodiments of the present invention.

As such, once a voltage level of a data input signal IN that is output from an external power circuit unit rises to a threshold voltage Vth of the transistor while the data input signal IN transits from a logic low level to a logic high level, as shown in FIG. 9, level-down shifters according to embodiments of the present invention output a data output signal OUT that transits from a logic high level, which is equal to an internal power voltage level, to a logic low level to an internal power circuit unit. Once the voltage level of the data input signal IN drops to the threshold voltage Vth of the transistor while the data input signal IN transits from a logic high level to a logic low level, the level-down shifters output the data output signal OUT that transits from the logic high level to the logic low level to the internal power circuit unit. Therefore, a balanced output signal is transmitted with no or minimal skew between two circuit units operating at different voltages.

While the present invention has been particularly shown and described with reference to exemplary embodiments thereof, it will be understood by those of ordinary skill in the art that various changes in form and details may be made therein without departing from the spirit and scope of the invention as defined by the appended claims and their equivalents.

What is claimed is:

1. A level-down shifter comprising:
 a first circuit unit having an input and an output and being connected to a first power node, the first circuit unit has its input connected to a first node and receives an input signal that swings from ground to a first voltage level and has its output connected to a second node;
 a second circuit unit having an input and an output and being connected to a second power node, the second circuit unit has its input connected to the second node and receives the output of the first circuit unit;
 a third circuit unit having an input and an output and being connected to the second power node, the third circuit unit has its input connected to the first node and receives at its input the in put signal and has its output connected to a third node; and
 a fourth circuit unit having an input and an output and being connected to the second power node, the fourth circuit unit has its input connected to the third node and receives the output of the third circuit unit and has its output connected to the output of the second circuit unit at a fourth node.

2. The circuit of claim 1, wherein a first voltage is applied to the first power node and a second voltage is applied to the second power node, wherein the first voltage is set at the first voltage level, and wherein the first voltage level is higher than the second voltage.

3. The circuit of claim 2, wherein the first power has the voltage level ranging from about 2.0V to about 2.8 V and the second power has a voltage level ranging from about 1.8V to about 2.2V.

4. An interface circuit comprising:
 a first power circuit having an input and an output, powered by a first power and receives an input signal that swings from a ground voltage level to a voltage level of the first power;
 a level-down shifter which converts the output of the first power circuit from a voltage level of the first power to an output having a voltage level of a second power; and a second power circuit having an input and an output, powered by the second power and receives the output of the level-down shifter, and outputs an output signal that swings from ground to the voltage level of the second power, wherein the level-down shifter includes:

a first circuit unit having an input and an output and being connected to a first power node, the first circuit unit has its input connected to a first node and receives the output of the first power circuit and has its output connected to a second node;

a second circuit unit having an input and an output and being connected to a second power node, the second circuit unit has its input connected to the second node and receives the output of the first circuit unit;

a third circuit unit having an input and an output and being connected to the second power node, the third circuit unit has its input connected to the first node and receives the output of the first power circuit and has its output connected to a third node; and a fourth circuit unit having an input and an output and being connected to the second power node, the fourth circuit unit has its input connected to the third node and receives the output of the third circuit unit and has its output connected to the output of the second circuit unit at a fourth node.

5. The circuit of claim 4, wherein the first voltage level is higher than the voltage level of the second power.

6. The interface circuit of claim 4, wherein the first power has a voltage level ranging from 2.0V to about 2.8V and the second power has a voltage level ranging from about 1.8V to 2.2V.

* * * * *